United States Patent
Gabara et al.

(10) Patent No.: US 7,254,205 B2
(45) Date of Patent: Aug. 7, 2007

(54) SIGNAL PROCESSING METHOD AND APPARATUS FOR ENSURING A DESIRED RELATIONSHIP BETWEEN SIGNALS

(75) Inventors: Thaddeus John Gabara, Murray Hill, NJ (US); Adrian Patrick Lynam, Garristown (IL)

(73) Assignee: Agere Systems Inc., Allentown, PA (US)

( * ) Notice: Subject to any disclaimer, the term of this patent is extended or adjusted under 35 U.S.C. 154(b) by 760 days.

(21) Appl. No.: 10/702,286

(22) Filed: Nov. 6, 2003

(65) Prior Publication Data

US 2004/0066870 A1   Apr. 8, 2004

Related U.S. Application Data

(63) Continuation of application No. 09/374,258, filed on Aug. 13, 1999, now abandoned.

(51) Int. Cl.
*H04L 7/00* (2006.01)
(52) U.S. Cl. ..................................................... 375/355
(58) Field of Classification Search ................ 375/355, 375/371, 373, 376, 357, 224, 225, 226, 354; 370/241, 252, 310; 455/39
See application file for complete search history.

(56) References Cited

U.S. PATENT DOCUMENTS

| | | | |
|---|---|---|---|
| 4,584,695 A | | 4/1986 | Wong et al. |
| 5,309,438 A | * | 5/1994 | Nakajima .............. 370/395.61 |
| 6,188,692 B1 | * | 2/2001 | Huscroft et al. ....... 370/395.51 |
| 6,249,542 B1 | * | 6/2001 | Kohli et al. ................. 375/150 |
| 6,418,176 B1 | * | 7/2002 | Ho et al. ..................... 375/372 |

FOREIGN PATENT DOCUMENTS

| | | |
|---|---|---|
| EP | 0 174 880 A1 | 3/1986 |
| JP | 55-008103 | 1/1980 |
| JP | 01-296734 | 11/1989 |
| JP | 02-107036 | 4/1990 |
| JP | 05-344112 | 12/1993 |

OTHER PUBLICATIONS

P. Plaza et al., "A 2.5 Gb/s ATM Switch Chip Set," IEEE Transactions on Very Large Scale Integration (VLSI) Systems, vol. 4, No. 3, pp. 405-415, Sep. 1996.

* cited by examiner

*Primary Examiner*—Pankaj Kumar

(57) ABSTRACT

A signal processing circuit and method in which a given signal, e.g., a receive data clock associated with a first chip and generated by a deserializer circuit, is synchronized with another signal, e.g., a clock signal from a second chip which is asynchronous with the receive data clock. The circuit may include first, second and third processing circuits, each of which performs a sampling function on a corresponding one of an early version, a middle version and a late version of the given signal, utilizing the clock signal to which the given signal is to be synchronized. A logic circuit coupled to outputs of each of the first, second and third processing circuits generates a control signal indicative of the presence or absence of a desired relationship, e.g., a desired phase relationship, between the clock signal and the first, second and third versions of the given signal. A selection circuit, e.g., a set of multiplexers, is responsive to the control signal to alter the phase relationship between the clock signal and the first, second and third versions of the given signal if the control signal indicates the absence of the desired relationship. The logic and selection circuits may be configured as part of a feedback control loop which automatically maintains the desired relationship.

15 Claims, 13 Drawing Sheets

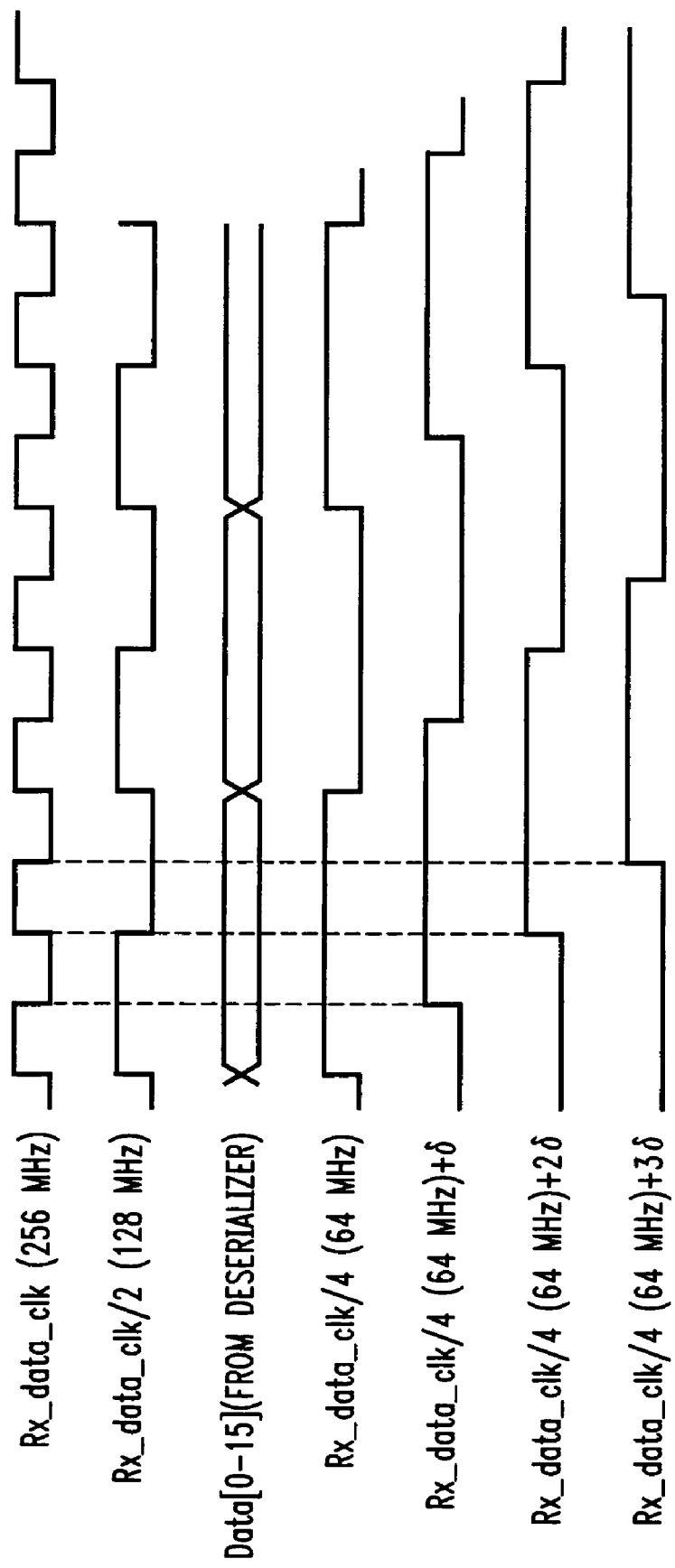

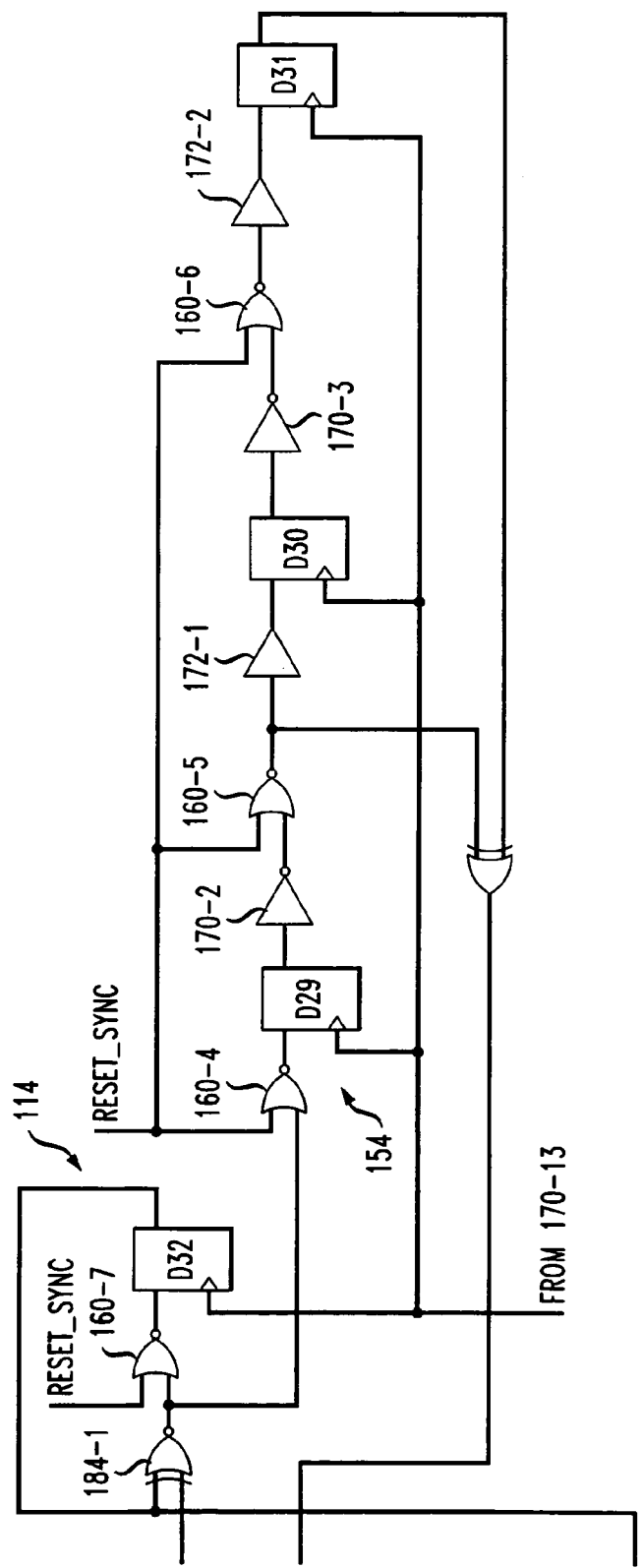

SIGNAL PROCESSING METHOD AND APPARATUS FOR ENSURING A DESIRED RELATIONSHIP BETWEEN SIGNALS

CROSS REFERENCE TO RELATED APPLICATIONS

This application is a continuation of the U.S. application identified by Ser. No. 09/374,258, filed Aug. 13, 1999, now abandoned the disclosure of which is incorporated by reference herein.

FIELD OF THE INVENTION

The present invention relates generally to electronic circuits, and more particularly to synchronization techniques and other signal processing techniques suitable for use in applications involving the transfer of data between circuits which operate with signals having an unknown or indeterminate relationship, e.g., an unknown or indeterminate phase relationship.

BACKGROUND OF THE INVENTION

In many electronic circuit applications, data signals from one device need to be delivered to another device. For example, data signals from a particular chip in an application-specific integrated circuit (ASIC) may be delivered via appropriate interconnects to another chip in the same ASIC. In order to reduce the number of inter-chip interconnects required in such an application, it is not uncommon for a set of data lines from one chip to be at least partially serialized before being delivered over the interconnects to the other chip. The function is performed by a circuit known as a serializer.

In operation, a serializer in the first chip takes a set of output data lines, e.g., a set of 16 data lines, and generates an output requiring a reduced set of data lines, e.g., a set of four data lines, by at least partially serializing the data, e.g., converting the output data from a 16-line parallel arrangement to a 4-line parallel arrangement. A corresponding deserializer in the second chip receives the serialized data, and converts it back to its original parallel format. A first chip clock signal is also typically delivered from the first chip to the second chip for use in the deserialization process. The data may then be processed in the parallel format in the second chip, using a clock signal associated with the second chip.

A problem that arises in the above-described serialization and deserialization process is that, although the clock signals of the first and second chips typically have the same frequency, the phase relationship between these clock signals is usually unknown, i.e., the clock signals are asynchronous. This can lead to other significant problems, such as violation of minimum setup and hold times in the second chip, or metastability. It is therefore generally necessary to synchronize the deserialized data stream with a known clock signal phase, such that the deserialized stream can be properly processed in the second chip. One approach to providing this synchronization is a clock recovery technique in which the data is used as an input to a phase-locked loop (PLL) which recovers an appropriately-timed system clock. Unfortunately, this approach may not be suitable for applications in which a large number of synchronous clocks need to be provided in the second chip.

Another synchronization approach involves oversampling the incoming data with multiphase clocks from a PLL. However, this approach is also unsuitable for use in certain applications, in that it typically requires a custom PLL which may not be desirable to include in the chip. Yet another conventional approach is that described in P. Plaza et al., "A 2.5 Gb/s ATM Switch Chip Set," IEEE Transactions on Very Large Scale Integration (VLSI) Systems, Vol. 4, No. 3, pp. 405-415, September 1996, which eliminates the phase difference by asynchronously writing each of the output data lines from the deserializer to a corresponding FIFO buffer, and then reading out the data using a common system clock. The drawbacks of this approach are that it generally introduces a significant amount of latency, and may also significantly increase circuit cost and complexity.

A need therefore exists for improved signal procesing techniques suitable for use in applications involving the transfer of data between asynchronously-clocked chips or other types of circuits, devices and systems.

SUMMARY OF THE INVENTION

The invention in an illustrative embodiment provides improved synchronization techniques for use in transferring data between asynchronously-clocked chips, and in numerous other synchronization applications. In accordance with the invention, a given signal, e.g., a receive data clock associated with a first chip and generated by a deserializer circuit, is synchronized with another signal, e.g., a clock signal from a second chip which is asynchronous with the receive data clock. The synchronization is performed in the illustrative embodiment in a synchronization circuit which includes first, second and third processing circuits, each of which performs a sampling function on a corresponding one of an early version, a middle version and a late version of the given signal, utilizing the clock signal to which the given signal is to be synchronized. A logic circuit coupled to outputs of each of the first, second and third processing circuits generates a control signal indicative of the presence or absence of a desired phase relationship between the clock signal and the first, second and third versions of the given signal. A selection circuit, e.g., a set of multiplexers, is responsive to the control signal to alter the phase relationship between the clock signal and the first, second and third versions of the given signal if the control signal indicates the absence of the desired phase relationship. The logic and selection circuits may be part of a feedback control loop which automatically maintains the desired phase relationship.

The middle version of the given signal to be synchronized in the illustrative embodiment corresponds generally to the early version delayed by a first amount of time, and the late version corresponds to the middle version delayed by a second amount of time. The first and second amounts of time are generally substantially the same, such that the middle version of the given signal has a transition edge which is located approximately midway between a corresponding transition edge in the early and late versions. This configuration allows the early and late versions to serve as "feelers" for detecting phase-related problems, e.g., violation of setup and hold times or metastability, such that appropriate phase adjustments may be made before the problems affect transferred data associated with the middle version.

Each of the first, second and third processing circuits in the above-noted embodiment may be configured to include a series-connected set of flip-flops, with each of the flip-flops in a given series-connected set of flip-flops clocked by the particular clock signal to which the given signal is to be synchronized. The sampling function in this case corresponds to clocking the respective first, second and third versions of the given signal through the corresponding series-connected set of flip-flops. The logic circuit receives an output signal from each of the series-connected sets of flip-flops, and generates the control signal based on whether or not the output signals have the same logic value within a designated sample window. The logic circuit may include, e.g., a decision logic block for determining the presence or absence of the desired phase relationship based on the outputs of the sets of flip-flops, and a multi-bit counter circuit which is incremented or decremented when the decision logic block determines that the desired phase relationship is absent, such that the above-noted control signal corresponds to an output of the counter circuit. As another example, a one-bit counter, e.g., a set-reset latch, may be used in place of the multi-bit counter, such that the control signal is implemented as a one-bit binary signal.

Advantageously, a synchronization circuit configured in accordance with the invention allows the transfer of data between asynchronously-clocked chips, without the need for custom PLLs, multi-FIFO buffers or other complex and problematic arrangements typical of conventional approaches. Although particularly well-suited for use in synchronization applications in which data is subject to a serialization and deserialization process, the techniques of the invention can provide similar advantages in a wide variety of other signal processing applications. For example, the techniques of the invention can be used to ensure desired relationships between other signal characteristics, such as frequency or voltage amplitude. These and other features and advantages of the present invention will become more apparent from the accompanying drawings and the following detailed description.

BRIEF DESCRIPTION OF THE DRAWINGS

FIGS. 4 and 5 are timing diagrams illustrating the operation of the FIG. 3 synchronizer.

DETAILED DESCRIPTION OF THE INVENTION

The present invention will be illustrated herein using exemplary synchronization circuits. It should be understood, however, that the invention is more generally suitable for use in any signal processing application involving an electronic circuit, device or system in which it is desirable to provide improved performance in terms of avoiding clocking-related problems such as violation of setup and hold times or metastability, or to otherwise ensure a particular relationship between signal characteristics such as phase, frequency, voltage amplitude, etc.

Figure 1:
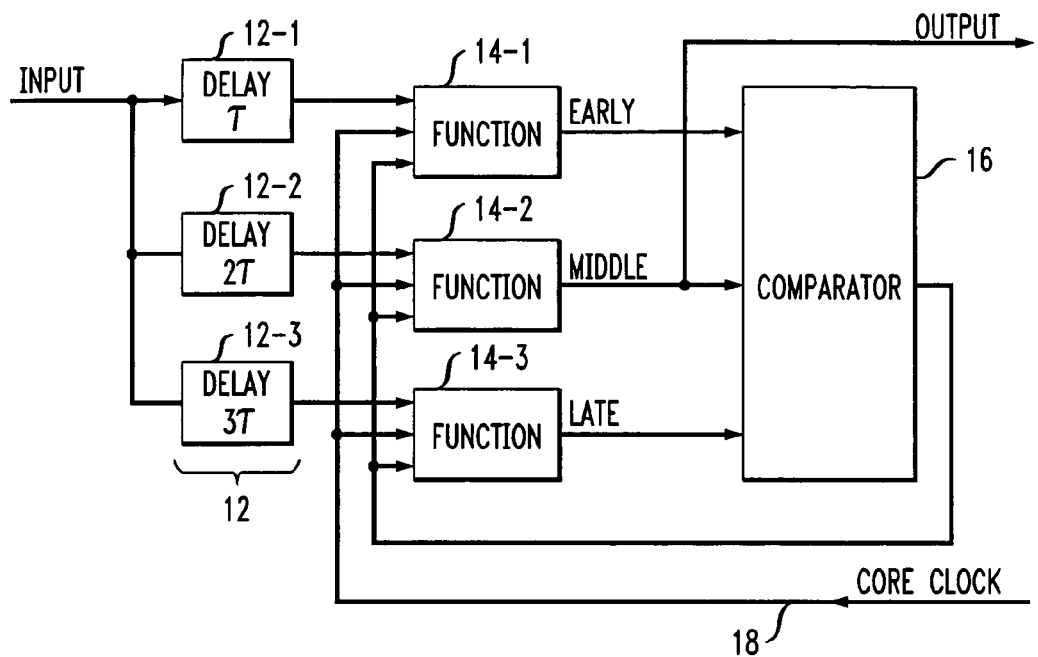
FIG. 1 is a generalized block diagram of a circuit suitable for use as a synchronizer in accordance with an illustrative embodiment of the invention.

FIG. 1 is a generalized block diagram of a circuit 10 in accordance with an illustrative embodiment of the invention. The circuit 10 may be used as a synchronizer circuit, in a manner to be described in greater detail below, as well as in other applications. In the circuit 10, an input data signal is separated into three portions, each of which is applied to a corresponding delay element 12-1, 12-2 or 12-3. Each of the three portions of the input data signal is subject to one of three different amounts of delay, i.e., delay elements 12-1, 12-2 and 12-3 provide designated amounts of delay corresponding to T, 2 T and 3 T, respectively. The outputs of the delay elements 12-1, 12-2 and 12-3 are applied to corresponding processing functions 14-1, 14-2 and 14-3, respectively, which are clocked by a core clock 18.

The processing functions 14-1, 14-2 and 14-3 are designed such that their outputs represent an early version, a middle version, and a late version, respectively, of the input data signal, each having a different phase. Each of these versions is applied to a comparator 16, which determines the relationship between the versions. An output of the comparator is applied as a control input to each of the functions 14-1, 14-2 and 14-3, such that adjustments may be made in the phase relationship between the versions to ensure that the middle version will always have a desired phase, i.e., will always correspond to properly-timed data. The early and later versions thus serve as "feelers" which can indicate the presence of potential clocking-related timing problems, such as a data transition edge being too close to a clock edge. Such a problem is first detected by the early or late version of the data signal, and the output of the comparator 16 makes appropriate adjustments in the generation of and relationship between the early, middle and late versions so as to ensure that the middle version is not affected by the problem.

The delay elements 12-1, 12-2 and 12-3 of FIG. 1 are an example of a delay circuit in accordance with the invention. Such a circuit is intended to include any arrangement of circuitry suitable for generating early, middle and late versions of a given signal. It should be noted that the early version of the signal may, but need not, correspond to an undelayed version of the signal. A "delay circuit" as the term is used herein may apply a delay only for a subset of the early, middle and late versions. The processing functions 14-1, 14-2 and 14-3 are examples of "processing circuits" in accordance with the invention. Other examples of such processing circuits include the sets of flip-flops 104, 106 and 108 to be described in detail below. Although the processing functions 14-1, 14-2 and 14-3 in this embodiment incorporate a selection function based on a control signal generated by the comparator 16, such a function may be considered as separate from the "processing circuit" operations of elements 14-1, 14-2 and 14-3.

It will be apparent to those skilled in the art that the circuit 10 of FIG. 1, although particularly well suited for use as a synchronizer circuit, may be modified in a straightforward manner to ensure the presence of another type of desired relationship, such as a particular relationship between signal frequency or signal voltage amplitude.

Figure 2:
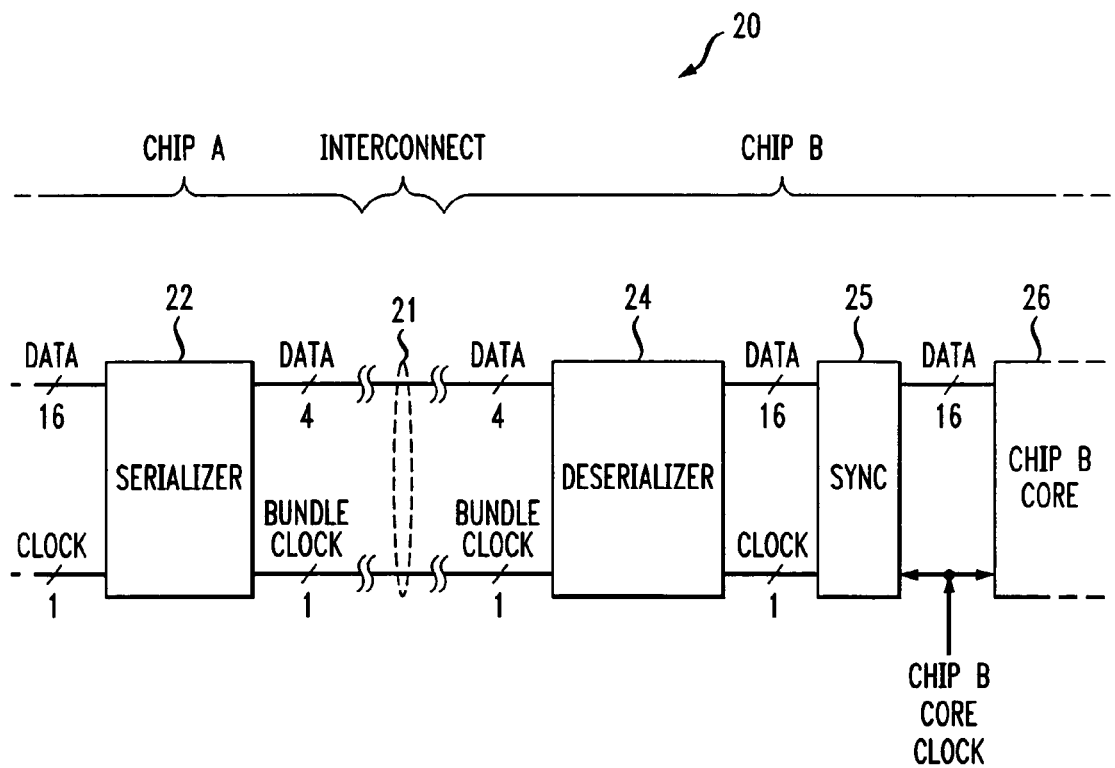
FIG. 2 illustrates a chip interconnect application which includes a synchronizer.

FIG. 2 shows a portion of an integrated circuit device 20 which includes a synchronizer circuit 25 based on the techniques described in conjunction with FIG. 1. The circuit 20 includes two chips, designated chip A and chip B, which are connected by an inter-chip interconnect 21. Only portions of chip A and chip B are shown in FIG. 2. The portion of chip A shown includes a serializer 22 which receives as inputs a parallel arrangement of 16 data lines, also collectively designated herein as Data[0-15], and a clock line. The output of the serializer 22 is a partially-serialized set of four data lines, and a so-called bundle clock, also designated herein as $CK_{bundle}$. These outputs are applied via inter-chip interconnect 21 to a deserializer 24 of chip B.

The deserializer 24 processes the partially-serialized data lines to generate a 16 data line output and a corresponding clock, both of which are applied to the synchronizer circuit 25. The synchronizer circuit 25 re-synchronizes the 16 lines of data with the chip B core clock, and delivers the synchronized data to a core 26 of chip B. The core 26 processes the received data in conjunction with the chip B core clock. The chip B core clock and the clock at the input of the synchronizer circuit 25 in this embodiment have the same frequency but different phases. Using the techniques of the invention, the synchronizer circuit 25 adjusts the received data to account for this difference in clock phase. The operation of various illustrative embodiments of the synchronizer circuit 25 will be described in detail below with reference to FIGS. 3 through 11.

Figure 3:
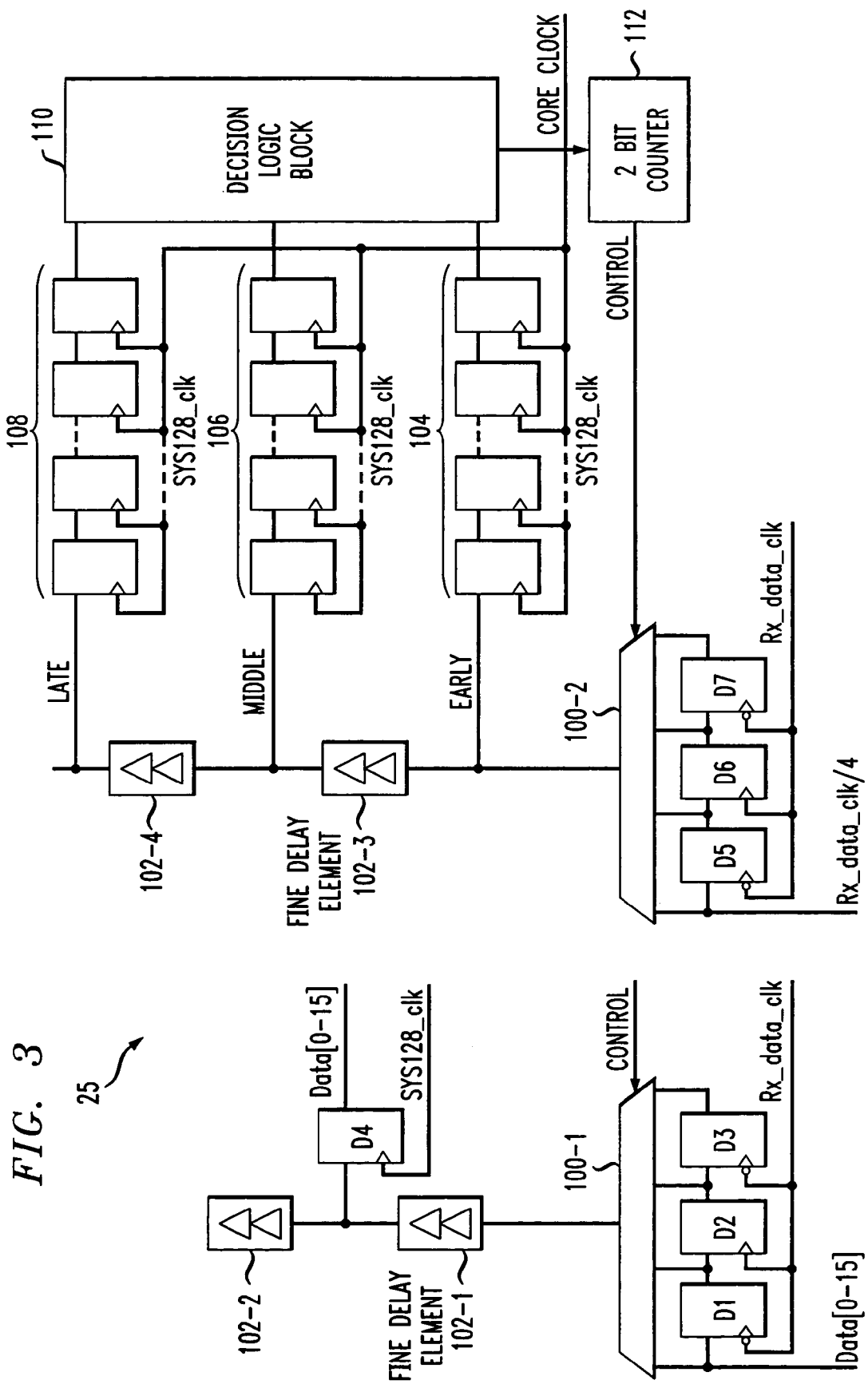
FIG. 3 shows an illustrative embodiment of a synchronizer suitable for use in the chip interconnect application of FIG. 2.

FIG. 3 shows an illustrative embodiment of a synchronizer 25 suitable for use in the chip interconnect application of FIG. 2. A receive data clock, denoted Rx_data_clk, is assumed in this embodiment to be 256 MHz, although other values could of course be used. The receive data clock corresponds generally to the clock supplied from the deserializer 24 of FIG. 2. This receive data clock is divided by 4, using well-known divider circuitry not shown in FIG. 3, to provided a 64 MHz clock signal, denoted Rx_data_clk/4, having the same period as a given data bit, i.e., a given cycle of Rx_data_clk/4 spends the same time duration high or low as a data bit. It is also assumed that all data are synchronous with each other and approximately synchronous to Rx_data_clk/4. Appropriate buffering may be used to ensure that this assumption is satisfied. It is further assumed that all signals have comparable rise and fall times, i.e., each data or clock signal must have transitions substantially as fast as those of the fastest signal used in the synchronizer circuit. This ensures that valid data is obtained and avoids unexpected metastability problems.

The 16-line data input Data[0-15] from deserializer 24 of FIG. 2 is applied to a data input of a bank of flip-flops D1, D2 and D3 connected in series. Unless otherwise specified, it is assumed the term "flip-flop" as used in conjunction with the description of the illustrative embodiments refers to a D-type flip-flop, although the invention could of course be utilized with other types of flip-flops. The flip-flops D1, D2 and D3 are clocked by the above-noted Rx_data_clk. The timing diagram of FIG. 4 shows the relationship between the Data[0-15] input and Rx_data_clk, Rx_data_clk/2 and Rx_data_clk/4 signals.

Based on the value of a control signal applied to a select signal input of a multiplexer 100-1, an amount of delay equivalent to either 0, 1, 2 or 3 flip-flop delays is applied to the Data[0-15] signal, i.e., the Data[0-15] signal from one of the four inputs of the multiplexer 100-1 is selected. The phase of the delayed Data[0-15] signal is then further adjusted using a pair of fine delay elements 102-1 and 102-2, and the resulting Data[0-15] signal is clocked through a flip-flop D4 using the local system core clock, referred to as SYS128_clk, which is assumed to be a 128 MHz clock signal in this embodiment. SYS128_clk corresponds generally to the chip B core clock of FIG. 2, and element D4 may be considered part of the chip B core 26 of FIG. 2. The fine delay elements 102-1 and 102-2 could be implemented using, e.g., a particular number of series-connected inverters, or other suitable arrangements of well-known circuitry.

The Rx_data_clk/4 signal is applied as a data input to a set of three flip-flops D5, D6 and D7. Each of the flip-flops D5, D6 and D7 is clocked by the Rx_data_clk signal, which has a known phase relationship with respect to the Rx_data_clk/4 signal. This in effect creates different delayed versions of the Rx_data_clk/4 signal. The relationship between the Rx_data_clk/4 and the de versions thereof is shown in the FIG. 4 timing diagram. The output of the flip-flops D5, D6 and D7 corresponds to the original Rx_data_clk/4 signal delayed by δ, 2δ and 3δ, respectively, where an amount of delay substantially equivalent to one-half period of the Rx_data_clk signal, as indicated in FIG. 4. The original Rx_data_clk/4 signal and the three delayed versions thereof are applied as inputs to a multiplexer 100-2. Based on the value of the above-noted control signal applied to a select signal input of the multiplexer 100-2, a particular one of the four inputs of the multiplexer 100-2 is selected.

The selected version of the Rx_data_clk/4 signal is applied directly to a data input of a first set of flip-flops 104. The selected version is also passed through fine delay element 102-3 before being applied to a data input of a second set of flip-flops 106, and is then passed through another fine delay element 102-4 before being applied to a data input of a third set of flip-flops 108. The fine delay elements 102-3 and 102-4, like elements 102-1 and 102-2, may be implemented using inverters. The particular versions of the selected Rx_data_clk/4 signal applied to the first, second and third sets of flip-flops 104, 106 and 108 are referred to herein as early, middle and late versions, respectively. The relationship between the early, middle and late versions is as previously described in conjunction with FIG. 1. Each of the flip-flops in the sets of flip-flops 104, 106 and 108 are clocked by SYS128_clk, the local system clock, which has an unknown phase relationship with the Rx_data_clk/4 clock signal.

The outputs of the sets of flip-flops 104, 106 and 108 are applied to a decision logic block 110 which determines whether a transition, edge in the particular delayed version of the Rx_data_clk/4 signal selected by the multiplexer 100-2 is too near a transition edge of the local SYS128_clk signal. If a transition edge in the selected version of the Rx_data_clk/4 signal is too close to a SYS128_clk transition edge, problems such as setup or hold time violations or metastability may result. Since the same control signal used in multiplexer 100-2 to select a particular delayed version of the Rx_data_clk/4 signal is also used in multiplexer 100-1 to select a particular delayed version of the Data[0-15] signal, and since the transitions in the Data[0-15] signal are synchronous with the transitions in the Rx_data_clk/4 signal, an indication that a transition edge of the selected version of the Rx_data_clk/4 signal is too close to a transition edge of the local system clock SYS128_clk will also indicate that the selected version of the Data[0-15] may not be properly clocked through the flip-flop D4.

The decision logic block 110 detects errors in clocking the Rx_data_clk/4 signals through the sets of flip-flops 104, 106 and 108 by determining whether or not the particular outputs of each set of flip-flops are in agreement. This process is illustrated in the timing diagram of FIG. 5. The sample window used by the decision logic block 110 is about two times the amount of fine delay provided by a given one of the fine delay elements 102-3 and 102-4, assuming that both provide substantially the same amount of delay. In other words, it is assumed in the embodiments described herein that the middle version is midway between the early and late versions, although this is not a requirement of the invention.

Figure 5A:
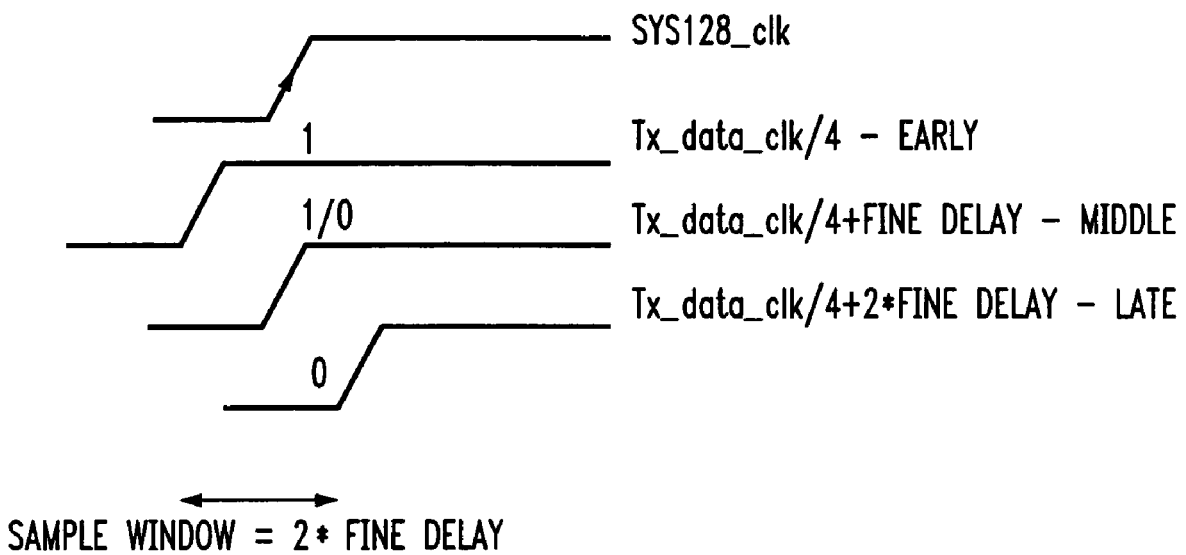
Figure 5B:
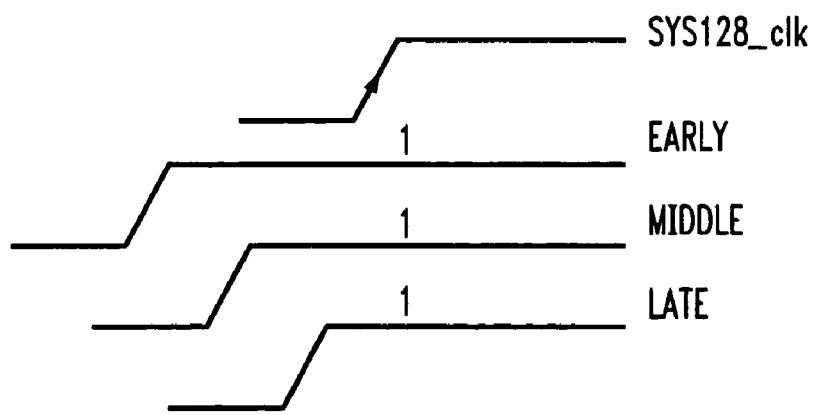

Case A in FIG. 5 shows an example of an unstable clocking situation in which the selected version of the Rx_data_clk/4 signal is too close to a transition edge of the SYS128_clk signal. In this case, the output of the set of flip-flops 104 processing the early version is a logic "1," but the outputs of the sets of flip-flops 106 and 108 processing the middle and late versions, respectively, are indeterminate, i.e., a logic "1" or a logic "0", and a logic "0", respectively. The sets of flip-flop 104, 106 and 108 are therefore not in agreement as to the proper output, and this situation is recognized by the decision logic block 110. The decision logic block 110 then directs a two-bit counter 112 to increment or decrement by one, thereby adjusting the control signal, and causing a different delayed version of the Data [0-15] and Rx_data_clk/4 signals to be selected by the respective multiplexers 100-1 and 100-2.

This process of adjusting the transition edge position of the Rx_data_clk/4 signal by selecting a different delayed version of that signal continues until the outputs of the sets of flip-flops 104, 106 and 108 are all in agreement. Case B in FIG. 5 shows an example of a stable clocking situation, in which all three of the early, middle and late versions of a given selected version of the Rx_data_clk/4 signal produce the same result, i.e., a logic "1" at the outputs of their respective sets of flip-flops 104, 106 and 108.

The particular number of flip-flops in a given one of the sets of flip-flops 104, 106 and 108 may vary depending upon factors such as the acceptable Mean Time Between Failure (MTBF) and the acceptable latency. The use of four flip-flops in each of the sets 104, 106 and 108 in the FIG. 3 embodiment is for purposes of illustration only, and not intended to indicate a preferred number of flip-flops for any particular application. In general, it is desirable to have a number of cascaded flip-flops in order to ensure that any metastability is resolved before it reaches the decision logic block. However, it should be noted that increasing the number of flip-flops in the sets of flip-flops will affect the latency, e.g., how quick the synchronizer operates after initialization or reacts after a synchronization error. A certain amount of initial latency may be deemed acceptable, e.g., if it is assumed that there will be no valid data for a designated number of clock cycles after an initialization of the system clocks. It is believed that the worst case data path latency through the synchronizer 25 of FIG. 3 after a stable clocking state is established is on the order of about one 128 MHz clock cycle.

It is assumed in the illustrative embodiments described herein that the two clocks which are being synchronized have the same frequency and are relatively stable, i.e., will not fluctuate widely with respect to each other over a few clock cycles. If the clocks vary slowly with respect to each other, i.e., due to temperature variations or the like, the synchronizer 25 will dynamically track the incoming data clock to the local system clock. As previously noted, this tracking operation of the synchronizer does not happen instantaneously, but generally requires a few clock cycles, the exact number being determined primarily by the number of cascaded flip-flops in the sets of flip-flops in a given embodiment.

Figure 6:
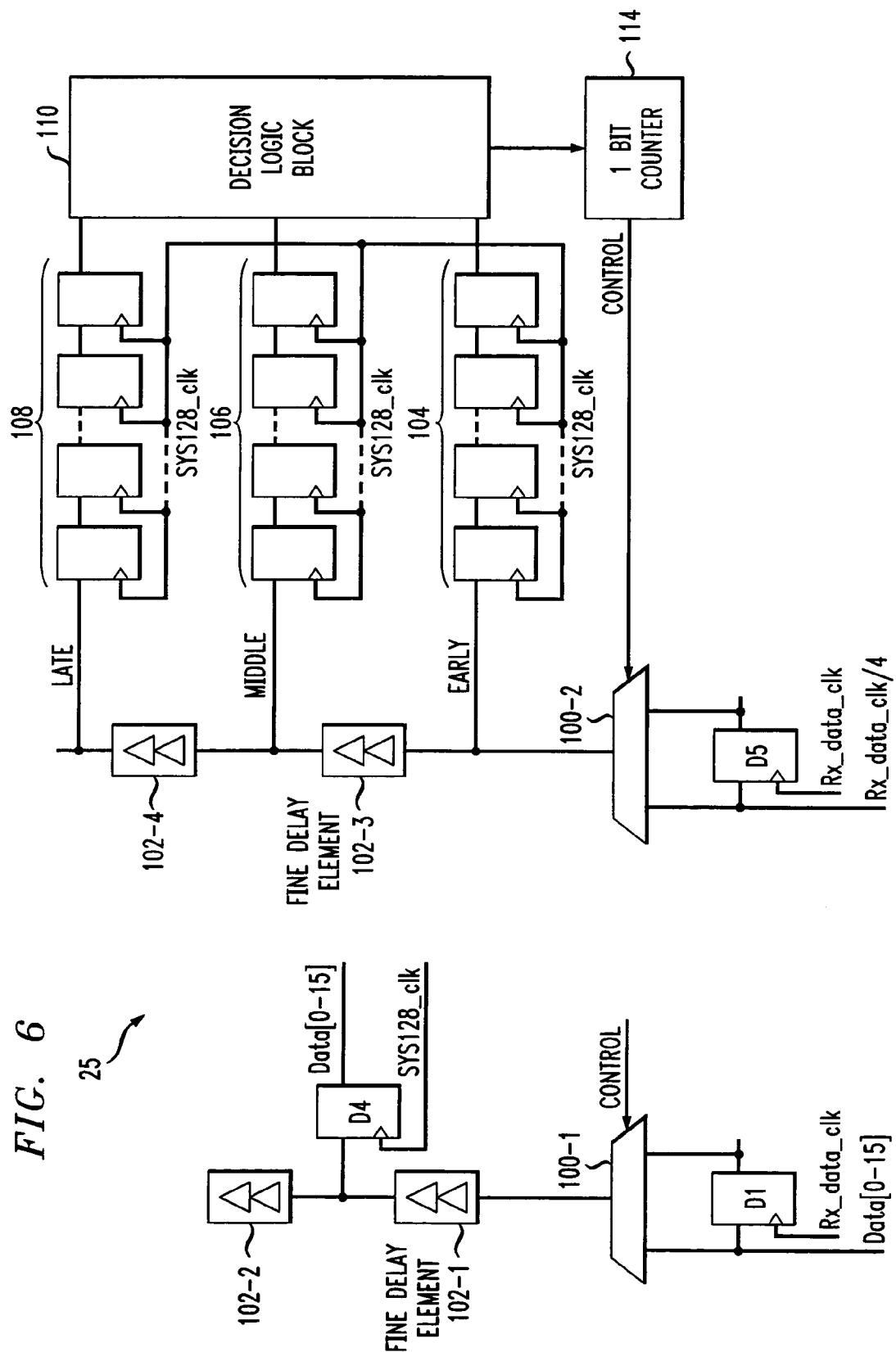
FIGS. 6 and 7 show other illustrative embodiments of synchronizers in accordance with the invention.

FIG. 6 shows another illustrative embodiment of synchronizer 25 in accordance with the invention. The operation of this embodiment is substantially the same as the FIG. 3 embodiment, except that the multiplexers 100-1 and 100-2 in the FIG. 6 embodiment select one of two possible versions of the respective Data[0-15] and Rx_data_clk/4 signals, rather than one of four as in the FIG. 3 embodiment. The FIG. 6 embodiment therefore includes a one-bit counter 114 rather than a two-bit counter, and flip-flops D2, D3, D6 and D7 are eliminated. Although this embodiment results in a substantially reduced gate count relative to the FIG. 3 embodiment, the degree of phase adjustability is also reduced, i.e., from a total possible adjustment of 3δ to a total possible adjustment of δ.

Figure 7:
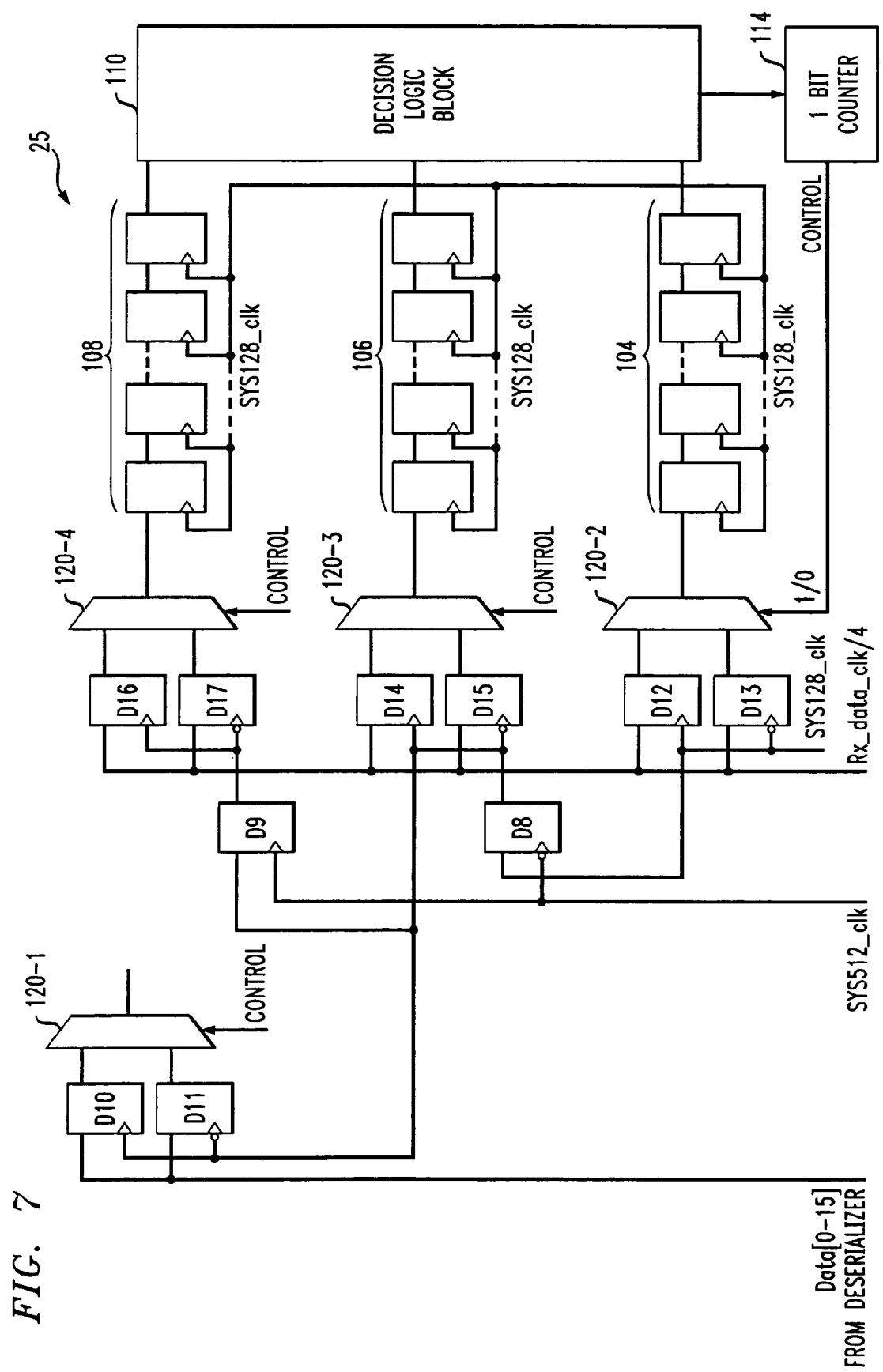

FIG. 7 shows another illustrative embodiment of synchronizer 25 in accordance with the invention. The operation of the FIG. 7 embodiment is basically similar to that of the FIG. 6 embodiment, except that instead of delaying the Rx_data_clk/4 signal by varying amounts, the local system clock SYS128_clk is delayed by varying amounts to produce early, middle and late versions thereof. The undelayed, early version of the SYS128_clk and its complement is used to clock the Rx_data_clk/4 signal through flip-flops D12 and D13, respectively. The middle and late versions of the SYS128_clk are generated by clocking SYS128_clk through flip-flops D8 and D9, respectively, using a 512 MHz system clock referred to as SYS512_clk. It should be noted that the SYS512_clk has a known phase relationship with the SYS128_clk, i.e., is synchronous with the SYS128_clk. The middle and late versions of the SYS128_clk and their respective complements are then used to clock the Rx_data_clk/4 signal through respective flip-flop pairs D14, D15 and D16, D17.

The control signal generated by the one-bit counter 114 is applied as a select signal to multiplexers 120-1, 120-2, 120-3 and 120-4. The multiplexer 120-1 selects a version of the Data[0-15] signal from either flip-flop D10 or flip-flop D11. The multiplexers 120-2, 120-3 and 120-4 select one of two different delayed versions of each of the respective early, late and middle versions of the Rx_data_clk/4 signal from the pairs of flip-flops D12, D13, D14, D15 and D16, D17, respectively.

As in the previous embodiments, the decision logic block 110 detects the output values generated by the three sets of flip-flops 104, 106 and 108, and determines if the current phase relationship between the Rx_data_clk/4 and the SYS128_clk is stable, i.e., yielding the same output value for the early, middle and late versions. If all three outputs of the sets of flip-flops 104, 106 and 108 are in agreement, the currently-selected timing should also be proper for reading the current version of the Data[0-15] signal at the output of the multiplexer 120-1.

If the three outputs are not in agreement, this indicates a problem such as a setup or hold time violation or metastability arising from the currently-selected timing. This case is illustrated in the timing diagram of FIG. 8, which shows an example of the Rx_data_clk/4 signal and the early, middle and late versions of the SYS128_clk signal. The sample window in this embodiment, i.e., the phase difference between the early and late versions, is one full cycle of the SYS512_clk signal. In other words, each of the flip-flops D8 and D9 delays the SYS128_clk signal by one-half period of the SYS512_clk signal. It can be seen that the timing relationship selected in the FIG. 8 example leads to inconsistent outputs for the sets of flip-flops 104, 106 and 108. More particularly, set 104 utilizing the early version of SYS128_clk produces a logic "0" output, set 106 utilizing the middle version produces an indeterminate output, and set 108 utilizing the late version produces a logic "1" output.

Figure 8:
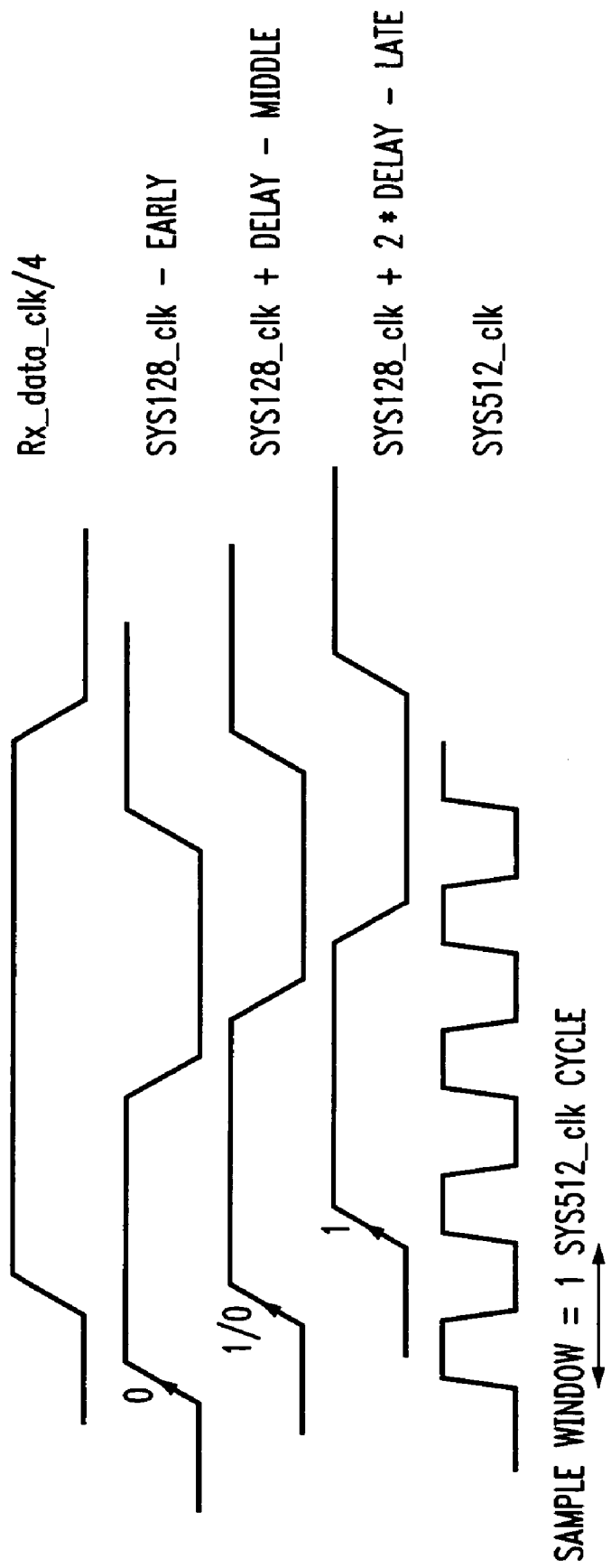
FIG. 8 is a timing diagram illustrating the operation of the FIG. 7 synchronizer.

In the event that the currently-selected timing produces outputs which are not in agreement, e.g., as in the example of FIG. 8, the decision logic block 110 toggles the one-bit counter 114 such that the Rx_data_clk/4 phase is effectively shifted by one-half period of the SYS128_clk signal. As in the previous embodiments, the synchronizer 25 of FIG. 7 dynamically tracks changes in phase, e.g., if the Rx_data_clk and local system clock SYS128_clk start to drift with respect to each other such that the decision logic block 110 detects errors, the synchronizer 25 will automatically switch to a stable clocking point.

An advantage of the FIG. 7 embodiment is that the delay elements for generating the middle and late versions of the Rx_data_clk/4 signal are flip-flops D8 and D9 clocked off the SYS512_clk signal, rather than delay lines or inverters. As such, a greater degree of control over the delay is provided, and the delay is less susceptible to variations in temperature, voltage and process parameters. Furthermore, making the delay a function of clock frequency in this manner allows the design to be used at lower or higher frequencies without the need for any changes in the delay elements.

Figure 9A:
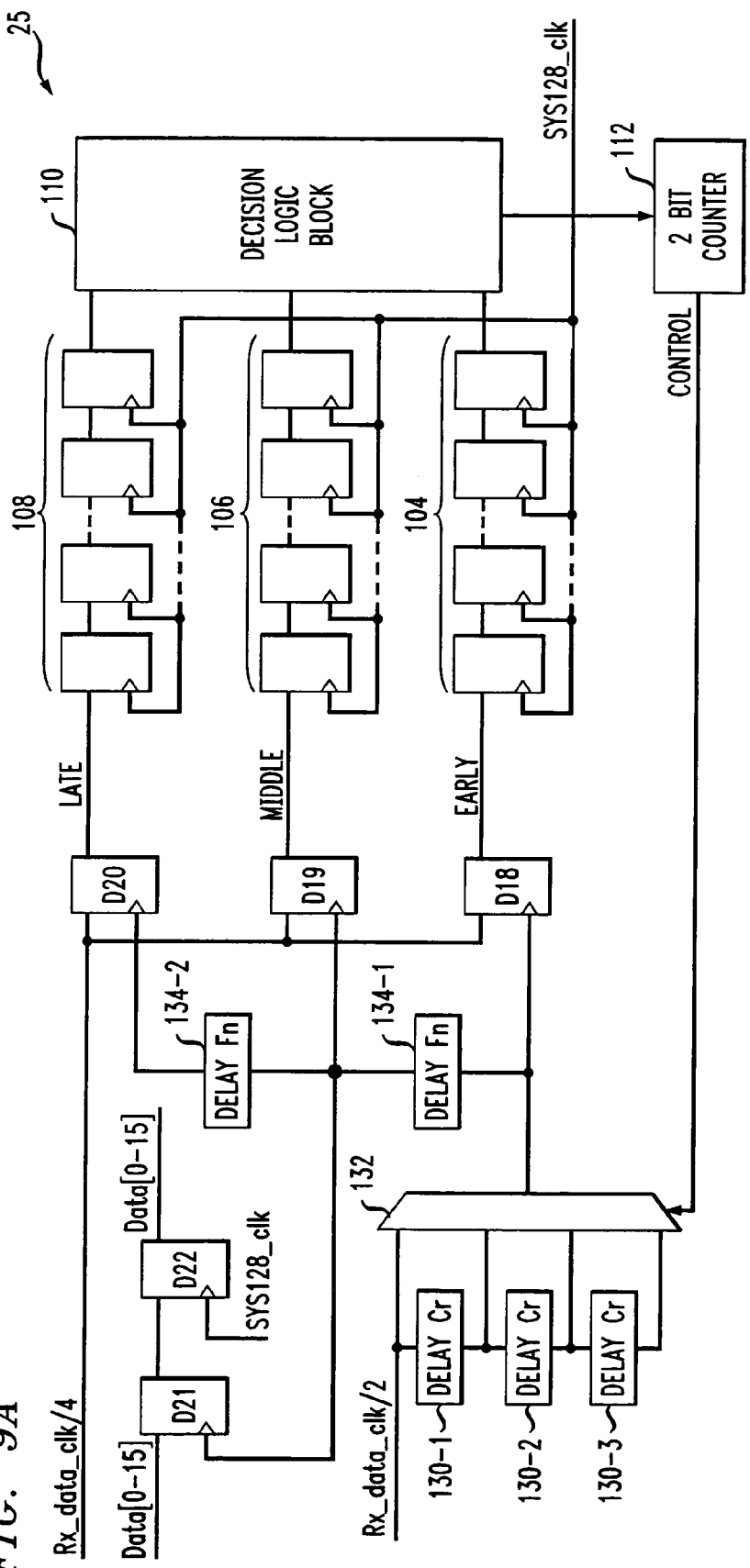
FIG. 9A shows another illustrative embodiment of a synchronizer in accordance with the invention.
Figure 9B:
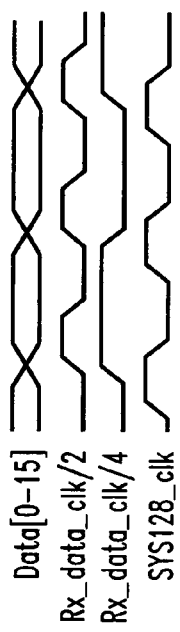
FIG. 9B is a timing diagram illustrating the relationship between various signals used in the FIG. 9A synchronizer.

FIG. 9A shows another illustrative embodiment of synchronizer 25 in accordance with the invention. A corresponding timing diagram is shown in FIG. 9B. In this embodiment, the Rx_data_clk/2 signal is passed through a set of three coarse delay elements 130-1, 130-2 and 130-3. The original Rx_data_clk/2 signal and the three delayed versions thereof are applied to inputs of a multiplexer 132. A particular one of the versions of the Rx_data_clk/2 signal is selected by multiplexer 132, in accordance with a signal supplied from the two-bit counter 112, and corresponds to an early version of the selected Rx_data_clk/2 signal. Middle and late versions of the Rx_data_clk/2 signal are generated by passing the early version through respective fine delay elements 134-1 and 134-2.

The early, middle and late versions of the Rx_data_clk/2 signal are applied to clock inputs of flip-flops D18, D19 and D20, respectively. The data inputs of the D18, D19 and D20 flip-flops are each driven by the Rx_data_clk/4 signal, and the corresponding outputs are applied to the respective sets of flip-flops 104, 106 and 108, respectively. As in the previous embodiments, the decision logic block 110 checks for agreement between the outputs of the sets of flip-flops 104, 106 and 108, and if necessary increments or decrements the two-bit counter 112 such that a different version of the Rx_data_clk/2 signal is selected by the multiplexer 132. The middle version of the selected Rx_data_clk/2 signal is also used to clock the Data[0-15] signal through the flip-flop D21. The SYS128_clk signal is used to clock the Data[0-15] signal from the output of D21 through the flip-flop D22.

Figure 10A:
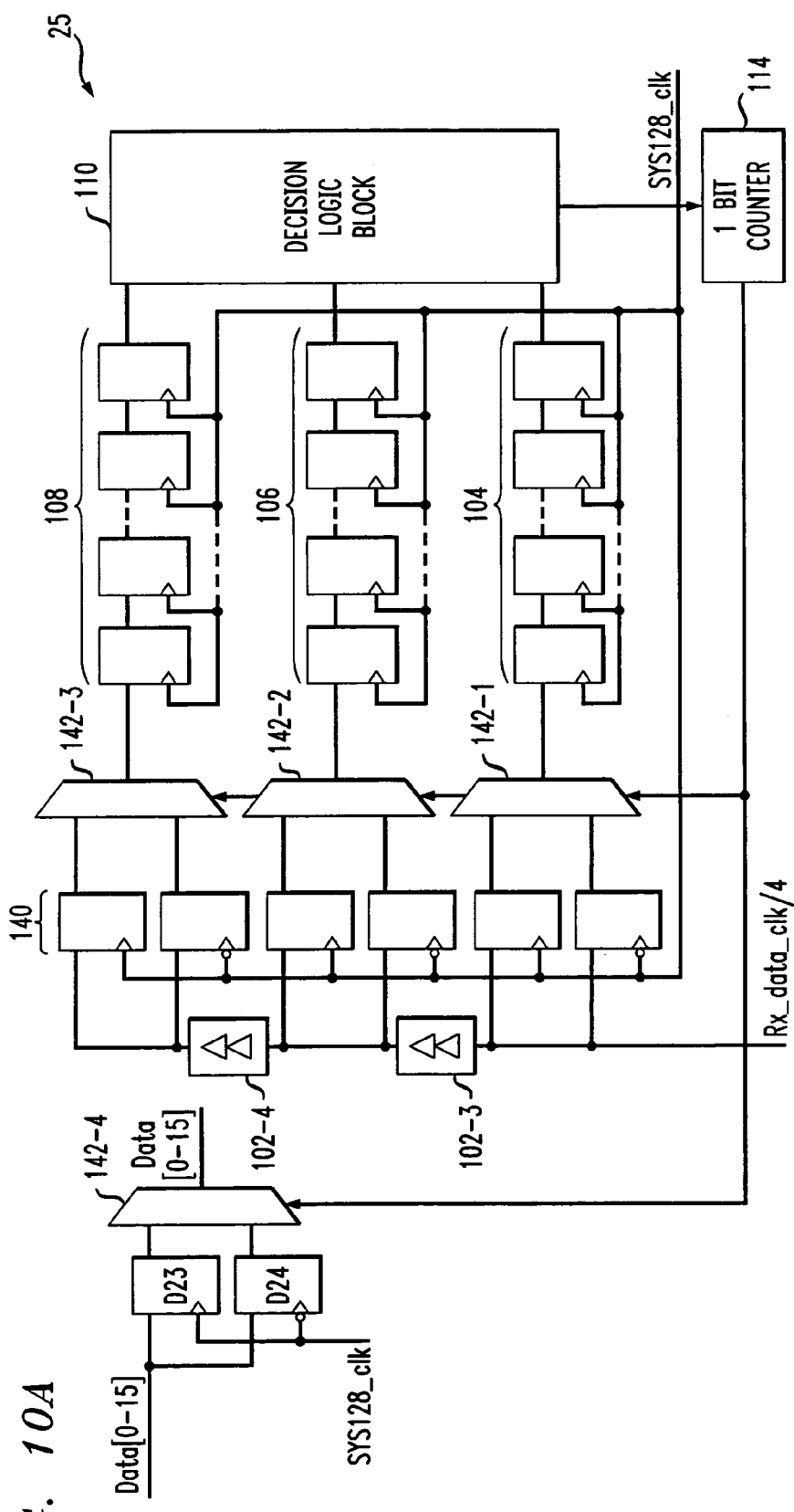
FIG. 10A shows another illustrative embodiment of a synchronizer in accordance with the invention.
Figure 10B:
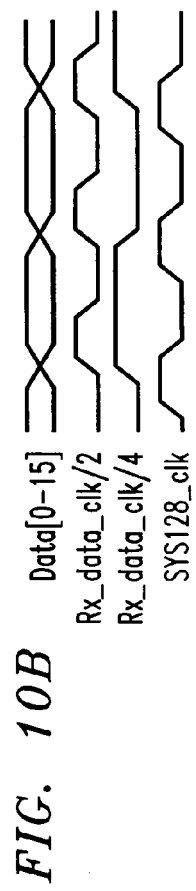
FIG. 10B is a timing diagram illustrating the relationship between various signals used in the FIG. 10A synchronizer.

FIG. 10A shows another illustrative embodiment of the synchronizer 25 in accordance with the invention. A corresponding timing diagram is shown in FIG. 10B. In this embodiment, the Rx_data_clk/4 signal is applied to the data inputs of each of six flip-flops in a set of flip-flops 140. The Rx_data_clk/4 signal is applied undelayed to inputs of two of the six flip-flops 140, and is applied as delayed by delay elements 102-3 and 102-4 to inputs of the remaining two pairs of the six flip-flops 140. A given one of the flip-flops in the set 140 is clocked with either the SYS128_clk signal or its complement, as shown. The Data[0-15] signal is clocked through flip-flop D23 by the SYS128_clk signal, and through flip-flop D24 by the complement of the SYS128_clk signal. A control signal from a set/reset device 146, e.g., a set/reset flip-flop, is applied to multiplexers 142-1, 142-2, 142-3 and 142-4, and used to select one of two different versions of the respective early, middle or late Rx_data_clk/4 signal and the Data[0-15] signal. The operation of the sets of flip-flops 104, 106 and 108, the decision logic block 110, and the one-bit counter 114 are previously described.

Figure 11A:
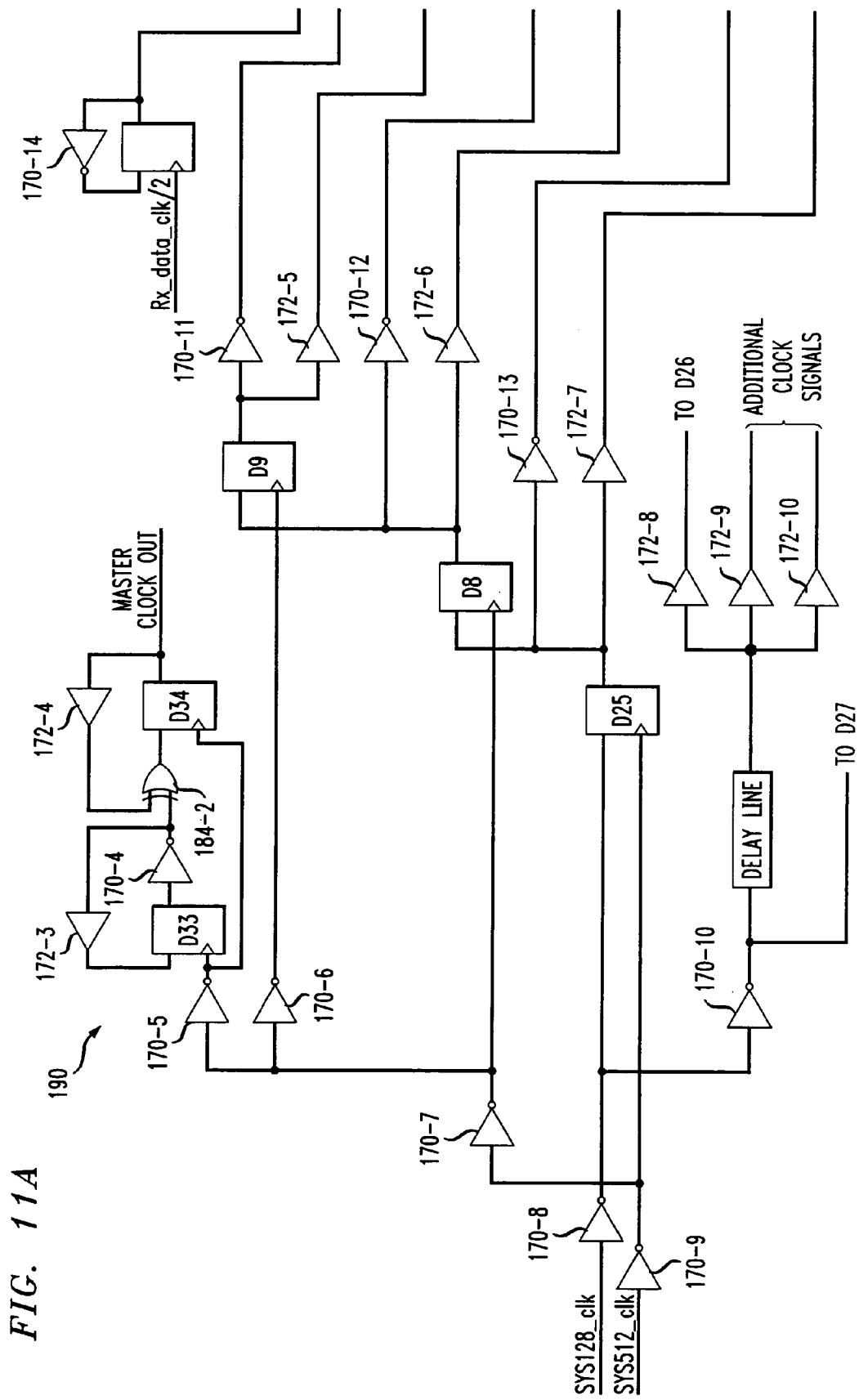
FIG. 11 is a more detailed schematic diagram of an exemplary synchronizer in accordance with the invention.
Figure 11B:
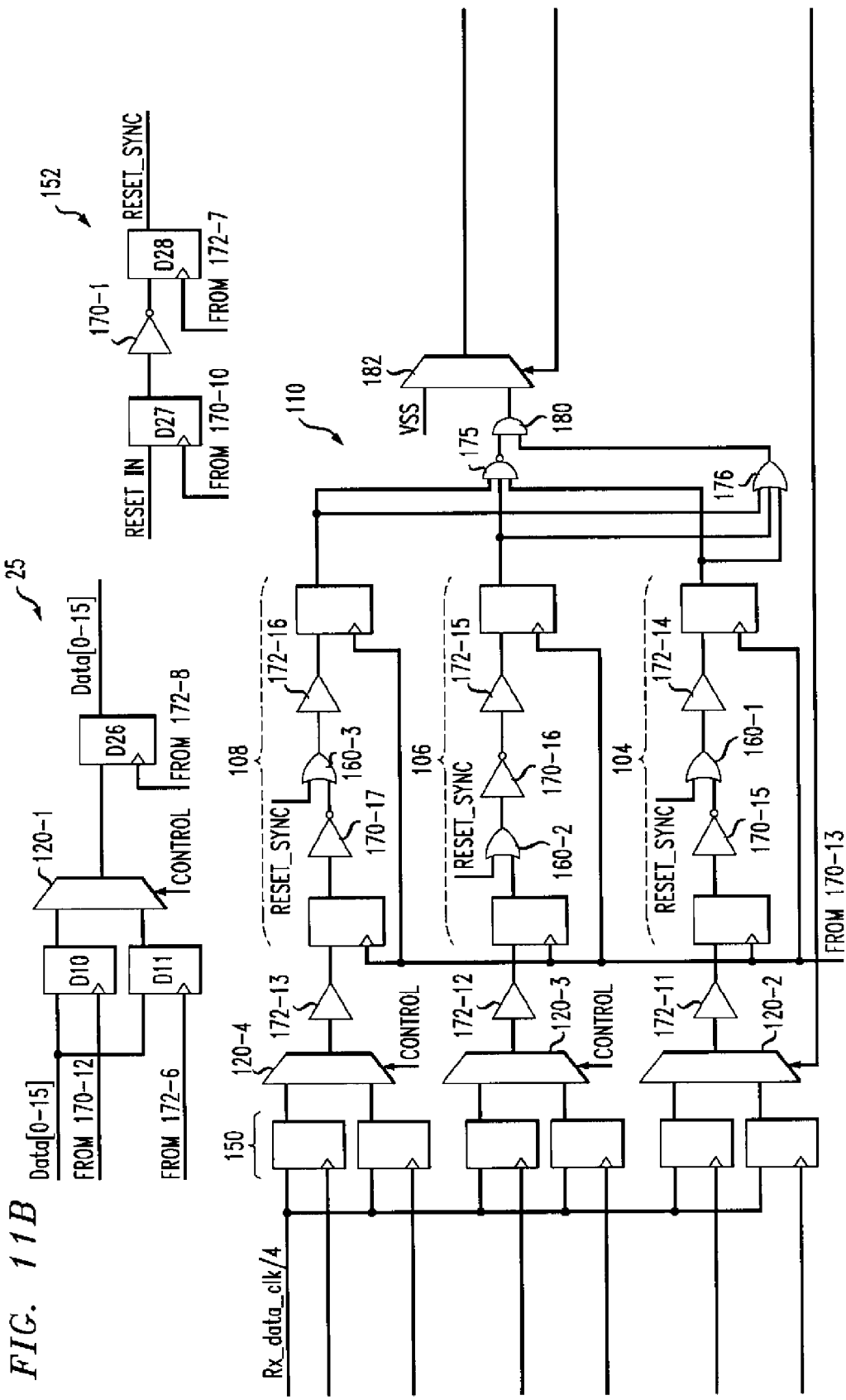

FIG. 11 is a more detailed schematic diagram of another illustrative embodiment of the synchronizer 25 in accordance with the invention. This embodiment is an alternative implementation of the FIG. 7 embodiment. Early, middle and late versions of the SYS128_clk are generated at the outputs of the flip-flops D25, D8 and D9, respectively. The Rx_data_clk/4 signal is applied to the data inputs of each of the flip-flops in the set of flip-flops 150. These flip-flops correspond generally to flip-flops D12 through D17 of FIG. 7. The Rx_data_clk/4 signal is clocked through each of the flip-flops 150 using the corresponding version of the SYS128_clk or its complement. Multiplexers 120-1, 120-2, 120-3 and 120-4 operate as previously described in conjunction with FIG. 7, selecting a given clocked version of each of the Data[0-15] signal and the early, middle and late versions of the Rx_data_clk/4 signal. The selected early, middle and late versions are applied to the respective sets of flip-flops 104, 106 and 108, which in this particular embodiment each include two flip-flops clocked by the early version of the SYS128_clk signal.

Figure 12:
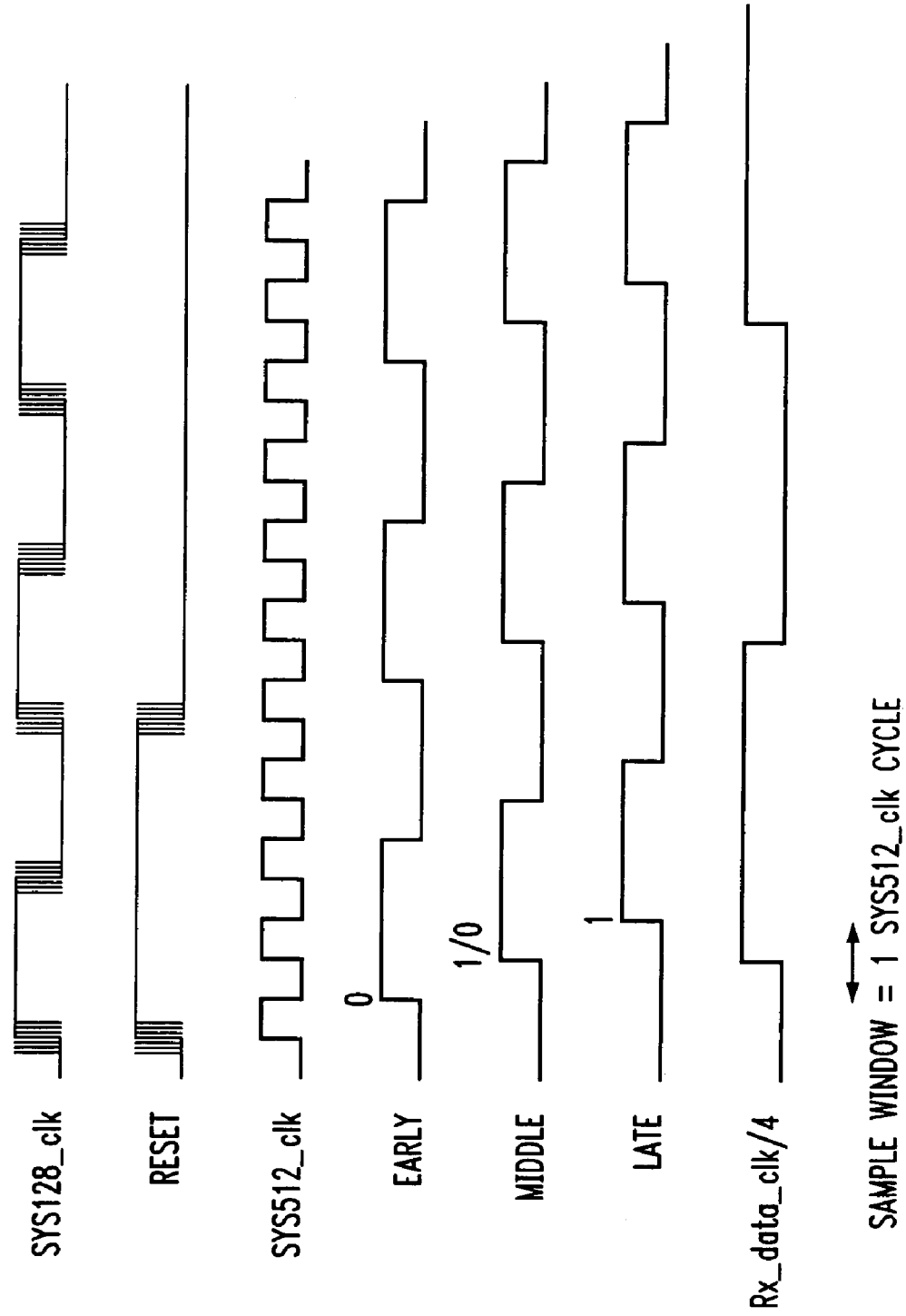
FIG. 12 is a timing diagram illustrating the operation of the FIG. 11 synchronizer.

The timing diagram of FIG. 12 shows the relationship between the SYS128_clk signal, the SYS512_clk signal, the Rx_data_clk/4 signal, and the early, middle and late versions of the SYS128_clk signal. The sample window in this case is again one cycle of the SYS512_clk signal. Also as in the FIG. 7 embodiment, the outputs of the sets of flip-flops 104, 106 and 108 are processed by the decision logic block 110, and a one-bit counter 114 generates a control signal which varies depending upon whether or not the outputs of the sets of flip-flops 104, 106 and 108 are in agreement. The FIG. 12 timing diagram illustrates a case in which the sets of flip-flops 104, 106 and 108 generate outputs which are not in agreement, i.e., a logic "0" at the output of the set 104, an indeterminate output at the output of set 106, and a logic "1" at the output of the set 108. When such a situation arises, the control signal is toggled, such that the multiplexers 120-1, 120-2, 120-3 and 120-4 select a different phase relationship, thereby ensuring that the Data[0-15] signal is properly clocked through the flip-flop D26. In this embodiment, the phase relationship is adjusted by one-half of a cycle of the SYS128_clk signal.

As previously noted, the sets of flip-flops 104, 106 and 108 in the FIG. 11 embodiment are clocked by the early version of the SYS128_clk, as generated by flip-flop D25, rather than directly by the SYS128_clk itself This was to avoid any unequal spacing between the early, middle and late versions attributable to skew between the SYS128_clk and the SYS512_clk, and any resulting setup or hold time violations or metastability problems, particularly in the set of flip-flops 108 corresponding to the late version. As shown in FIG. 11, the SYS128_clk is sampled with the negative edge of the SYS512_clk in D25 to generate the early version of the SYS128_clk, and this early version is then sampled in D8 using the following SYS512_clk positive edge to generate the middle version. The middle version is then sampled in D9 on the next negative edge of the SYS512_clk to generate the late version.

The FIG. 11 embodiment also includes additional circuitry 152, 154. The circuit 152 generates a reset signal RESET_SYNC designed to place the synchronizer 25 into a known state. An example of the reset signal is shown in the FIG. 12 timing diagram. The circuit 152 includes flip-flops D27 and D28 and inverter 170-1 interconnected as shown. The RESET_SYNC signal is applied to one input of each of the two-input OR gates 160-1, 160-2 and 160-3 in the sets of circuitry 104,106 and 108, respectively. The circuit 154 comprises a shift register formed from flip-flops D29, D30 and D31,two-input NOR gates 160-4, 160-5 and 160-6, inverters 170-2 and 170-3, and buffers 172-1 and 172-2. The shift register is operative to prevent the output of the decision logic block 110 from producing a change in the state of the multiplexers 120-1 through 120-4, for a period of three cycles of the early version of the SYS128_clk, in the presence of a transition or error attributable to metastability.

The decision logic block 110 in this embodiment includes a three-input NAND gate 175, a three-input OR gate 176, a two-input AND gate 180, and a multiplexer 182 interconnected as shown. The one-bit counter 114 in this embodiment includes a two-input XNOR gate 184-1, a two-input NOR gate 160-7, and a flip-flop D32 interconnected as shown.

A master clock signal is generated in this embodiment using a circuit 190 which includes flip-flops D33 and D34, inverter 170-4, buffers 172-3 and 172-4, and two-input XOR gate 184-2. Other circuitry associated with the generation of one or more of the clock signals used in the FIG. 11 embodiment includes inverters 170-5 through 170-14 and buffers 172-5 through 172-10. The synchronizer 25 also includes buffers 172-11, 172-12 and 172-13 coupled between the outputs of multiplexers 120-2, 120-3 and 120-4 and the corresponding inputs of the sets of circuitry 104, 106 and 108, respectively. The sets of circuitry 104, 106 and 108 further include inverters 170-15, 170-16 and 170-17 and buffers 172-14, 172-15 and 172-16, respectively, arranged as shown.

It should be emphasized that the exemplary synchronization circuits described herein are intended to illustrate the operation of the invention, and therefore should not be construed as limiting the invention to any particular embodiment or group of embodiments. For example, although illustrated using flip-flops as delay elements, the invention can be implemented using any other type of delay elements, including fixed or adjustable delay lines, series arrangements of inverters, etc. In addition, although particularly well suited for use in a synchronizer circuit which ensures a desired phase relationship, the techniques of the invention can also be used to ensure a desired relationship between other signal characteristics, including, e.g., frequency and voltage amplitude. Moreover, embodiments of the invention can be implemented in a wide variety of different configurations to accommodate the needs of particular applications. These and numerous other alternative embodiments within the scope of the following claims will therefore be apparent to those skilled in the art.

What is claimed is:

1. An apparatus comprising:
   first, second and third processing circuits, each operative to perform a sampling function on a corresponding one of a first version, a second version and a third version of a given signal, the processing circuits performing the sampling function utilizing at least one clock signal;
   a logic circuit coupled to outputs of each of the first, second and third processing circuits, and operative to generate a control signal indicative of the presence or absence of a desired relationship between the at least one clock signal and the first, second and third versions of the given signal; and
   a selection circuit having an input coupled to an output of the logic circuit, wherein the selection circuit is responsive to the control signal to alter a relationship between the at least one clock signal and the first, second and third versions of the given signal if the control signal indicates the absence of the desired relationship;
   wherein the logic circuit comprises a decision logic block for determining the presence or absence of the desired relationship, and a latch circuit which is set or reset when the decision logic block determines that the desired relationship is absent, and wherein the control signal corresponds to an output of the latch circuit.

2. The apparatus of claim 1 wherein the desired relationship comprises a desired voltage amplitude relationship.

3. The apparatus of claim 1 wherein the desired relationship comprises a desired frequency relationship.

4. The apparatus of claim 1 wherein the desired relationship comprises a desired phase relationship.

5. The apparatus of claim 1 wherein the given signal comprises a receive data clock delivered from a deserializer circuit, and wherein the receive data clock is to be synchronized to the at least one clock signal.

6. The apparatus of claim 1 wherein the at least one clock signal comprises a clock signal associated with a first chip, and the given signal comprises a receive data clock synchronous with another clock signal associated with a second chip.

7. The apparatus of claim 1 wherein the first, second and third versions of the given signal comprise an early version, a middle version and a late version of the given signal, wherein the middle version corresponds to the early version delayed by a first amount of time, and the late version corresponds to the middle version delayed by a second amount of time.

8. The apparatus of claim 7 wherein the first and second amounts of time are substantially the same, such that the middle version of the given signal has a transition edge which is located approximately midway between a corresponding transition edge in the early and late versions.

9. The apparatus of claim 1 wherein the first, second and third versions of the given signal are generated by clocking each of at least a subset of the first, second and third versions with a different delayed version of either the at least one clock signal or another clock signal which is synchronous with the at least one clock signal.

10. The apparatus of claim 1 wherein each of the first, second and third processing circuits comprises a series-connected set of flip-flops, with each of the flip-flops in the series connection of flip-flops clocked by the clock signal, and wherein the sampling function in each of the first, second and third processing circuits comprises clocking the respective first, second and third versions of the given signal through the corresponding series-connected set of flip-flops.

11. The apparatus of claim 10 wherein the logic circuit receives an output signal from each of the series-connected sets of flip-flops, and generates the control signal based on whether or not the output signals have the same logic value within a designated sample window.

12. An apparatus comprising:
   first, second and third processing circuits, each operative to perform a sampling function on a corresponding one of a first version, a second version and a third version of a given signal, the processing circuits performing the sampling function utilizing at least one clock signal;

a logic circuit coupled to outputs of each of the first, second and third processing circuits, and operative to generate a control signal indicative of the presence or absence of a desired relationship between the at least one clock signal and the first, second and third versions of the given signal; and a selection circuit having an input coupled to an output of the logic circuit, wherein the selection circuit is responsive to the control signal to alter a relationship between the at least one clock signal and the first, second and third versions of the given signal if the control signal indicates the absence of the desired relationship;

wherein the logic circuit comprises a decision logic block for determining the presence or absence of the desired relationship, and a counter circuit which is incremented or decremented when the decision logic block determines that the desired relationship is absent, and wherein the control signal corresponds to an output of the counter circuit.

13. An apparatus comprising:

first, second and third processing circuits, each operative to perform a sampling function on a corresponding one of a first version, a second version and a third version of a given signal, the processing circuits performing the sampling function utilizing at least one clock signal;

a logic circuit coupled to outputs of each of the first, second and third processing circuits, and operative to generate a control signal indicative of the presence or absence of a desired relationship between the at least one clock signal and the first, second and third versions of the given signal; and a selection circuit having an input coupled to an output of the logic circuit, wherein the selection circuit is responsive to the control signal to alter a relationship between the at least one clock signal and the first, second and third versions of the given signal if the control signal indicates the absence of the desired relationship;

wherein the logic circuit and the selection circuit form at least a portion of a closed loop control system for maintaining the desired relationship between the clock signal and the first, second and third versions of the given signal.

14. An apparatus comprising:

a first chip having a first signal associated therewith;

a second chip having a second signal associated therewith, wherein the first and second signals are asynchronous;

a serializer circuit associated with the first chip;

a deserializer circuit associated with second chip and having an input coupled to an output of the serializer circuit via an interconnect; and a synchronizer circuit associated with the second chip and having an input coupled to an output of the deserializer circuit, the synchronizer circuit comprising:

first, second and third processing circuits, each operative to perform a sampling function on a corresponding one of a first version, a second version and a third version of an output of the deserializer synchronous with the first signal, the processing circuits performing the sampling function utilizing at least the second signal;

a logic circuit coupled to outputs of each of the first, second and third processing circuits, and operative to generate a control signal indicative of the presence or absence of a desired phase relationship between the second signal and the first, second and third versions of the deserializer output; and a selection circuit having an input coupled to an output of the logic circuit, wherein the selection circuit is responsive to the control signal to alter a phase relationship between the second signal and the first, second and third versions of the deserializer output if the control signal indicates the absence of the desired phase relationship;

wherein the logic circuit comprises a decision logic block for determining the presence or absence of the desired relationship, and a latch circuit which is set or reset when the decision logic block determines that the desired relationship is absent, and wherein the control signal corresponds to an output of the latch circuit.

15. A method of processing signals, the method comprising the steps of:

performing a sampling function on a corresponding one of a first version, a second version and a third version of a given signal, utilizing at least one clock signal;

generating a control signal indicative of the presence or absence of a desired relationship between the at least one clock signal and the first, second and third versions of the given signal; and altering a relationship between the at least one clock signal and the first, second and third versions of the given signal if the control signal indicates the absence of the desired relationship;

wherein the generating step is implemented utilizing a logic circuit, and wherein the logic circuit comprises a decision logic block for determining the presence or absence of the desired relationship, and a latch circuit which is set or reset when the decision logic block determines that the desired relationship is absent, and wherein the control signal corresponds to an output of the latch circuit.

* * * * *

UNITED STATES PATENT AND TRADEMARK OFFICE
CERTIFICATE OF CORRECTION

PATENT NO. : 7,254,205 B2 Page 1 of 1
APPLICATION NO. : 10/702286
DATED : August 7, 2007
INVENTOR(S) : T.J. Gabara et al.

It is certified that error appears in the above-identified patent and that said Letters Patent is hereby corrected as shown below:

On the Title page:

In (75) Inventors:, please delete "(IL)" and insert --(IE)--.

In the specification:

Column 11, line 14, please delete "D3 1,two" and insert --D31, two--.

Signed and Sealed this

Sixth Day of November, 2007

JON W. DUDAS
*Director of the United States Patent and Trademark Office*